(12) United States Patent
Song et al.

(10) Patent No.: US 9,385,303 B2
(45) Date of Patent: Jul. 5, 2016

(54) RESONATOR AND FABRICATING METHOD THEREOF

(71) Applicant: Samsung Electronics Co., Ltd., Suwon-si (KR)

(72) Inventors: In Sang Song, Osan-si (KR); Ho Soo Park, Yongin-si (KR); Duck Hwan Kim, Goyang-si (KR); Chul Soo Kim, Hwaseong-si (KR); Sang Uk Son, Yongin-si (KR); Jea Shik Shin, Hwaseong-si (KR); Moon Chul Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 342 days.

(21) Appl. No.: 14/073,509

(22) Filed: Nov. 6, 2013

(65) Prior Publication Data

US 2014/0203686 A1 Jul. 24, 2014

(30) Foreign Application Priority Data

Jan. 22, 2013 (KR) ........................ 10-2013-0006898

(51) Int. Cl.
| | |
|---|---|
| *H03H 9/15* | (2006.01) |
| *H03H 9/00* | (2006.01) |
| *H01L 41/22* | (2013.01) |
| *H01L 41/314* | (2013.01) |
| *H03H 9/13* | (2006.01) |
| *H03H 9/17* | (2006.01) |

(52) U.S. Cl.
CPC ............. *H01L 41/314* (2013.01); *H03H 9/132* (2013.01); *H03H 9/174* (2013.01); *H03H 9/175* (2013.01)

(58) Field of Classification Search
USPC .......... 310/311–371; 333/187–192; 29/25, 35
See application file for complete search history.

(56) References Cited

U.S. PATENT DOCUMENTS

| 7,952,257 B2* | 5/2011 | Iwaki ..................... H03H 9/174 310/320 |
| 2011/0298564 A1* | 12/2011 | Iwashita .................. H03H 3/02 333/187 |
| 2013/0147577 A1* | 6/2013 | Nishihara .............. H03H 9/706 333/133 |
| 2014/0025683 A1* | 1/2014 | Howland .......... G06F 17/30598 707/740 |
| 2014/0176261 A1* | 6/2014 | Burak ...................... H03H 3/04 333/187 |
| 2015/0236162 A1* | 8/2015 | Yamazaki ........... H01L 29/7869 257/43 |

FOREIGN PATENT DOCUMENTS

KR 10-2010-0023892 A 3/2010

OTHER PUBLICATIONS

Pensala, Tuomas, and Markku Ylilammi. "Spurious Resonance Suppresion in Gigahertz-Range ZnO Thin-Film Bulk Acoustic Wave Resonators by the Boundary Frame Method: Modeling and Experiment." Ultrasonics, Ferroelectrics and Frequency Control, IEEE Transactions on 56.8 (2009): 1731-1744.

* cited by examiner

*Primary Examiner* — Thomas Dougherty
(74) *Attorney, Agent, or Firm* — NSIP Law

(57) ABSTRACT

Provided are a resonator and a method of fabricating the same. The resonator may include a first electrode disposed on a substrate, a piezoelectric layer disposed on the first electrode, a second electrode disposed on the piezoelectric layer, and a control layer disposed on the second electrode and having a frame with an uneven surface.

25 Claims, 14 Drawing Sheets

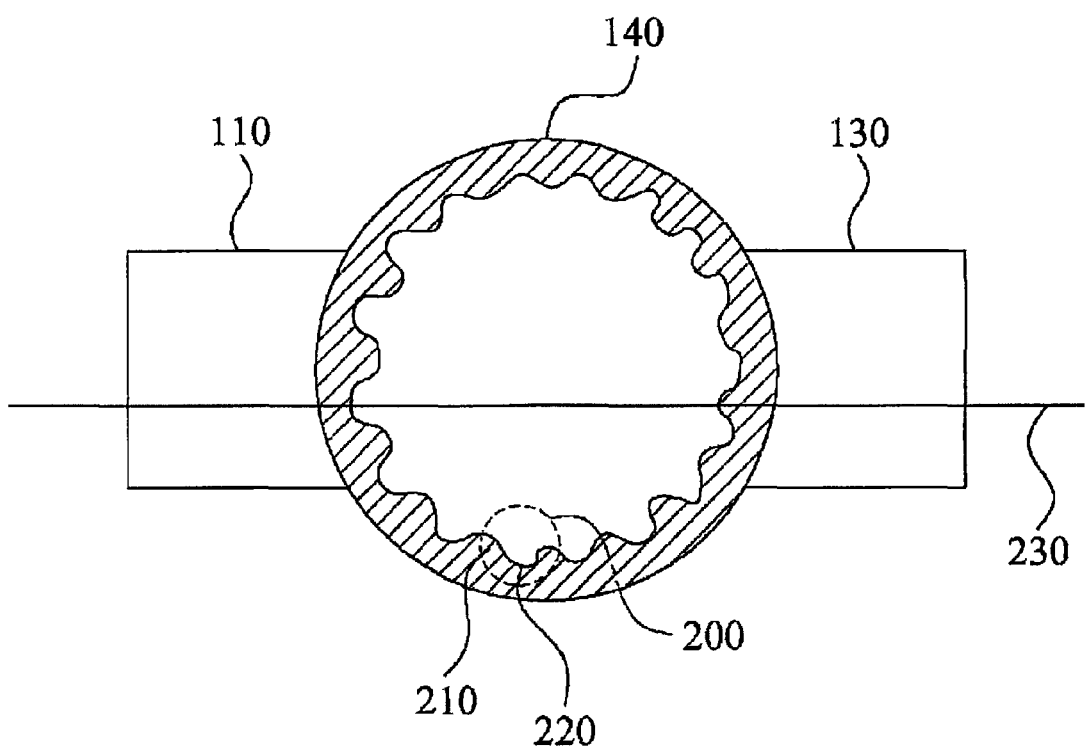

US 9,385,303 B2

RESONATOR AND FABRICATING METHOD THEREOF

CROSS-REFERENCE TO RELATED APPLICATION(S)

This application claims the benefit under 35 USC 119(a) of Korean Patent Application No. 10-2013-0006898 filed on Jan. 22, 2013, in the Korean Intellectual Property Office, the entire disclosure of which is incorporated herein by reference for all purposes.

BACKGROUND

1. Field

The following description relates to a resonator and a method of fabricating the same, and to a resonator with a frame that suppresses spurious resonance and a method of fabricating the same.

2. Description of Related Art

A bulk acoustic wave resonator (BAWR) is a device that utilizes longitudinal acoustic wave to generate resonance and utilizes the generated resonance electrically. In such a device, a reflector of various shapes may be provided at the bottom of the resonator to minimize the loss of longitudinal acoustic wave. However, even with the use of a reflector of high quality and performance, transverse acoustic wave may be generated in addition to the longitudinal acoustic wave due to characteristics of the film used in a BAWR, resulting in energy loss and a reduction of Q-factor of the resonator.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a resonator including: a first electrode disposed on a substrate; a piezoelectric layer disposed on the first electrode; a second electrode disposed on the piezoelectric layer; and a control layer disposed on the second electrode and comprising a frame with an uneven surface.

The piezoelectric layer may be configured to convert an electrical energy input from the first electrode into an acoustic wave; and the frame with the uneven surface may be configured to control the acoustic wave.

The frame may have a shape of a closed curved surface in a plan view, and the uneven surface may be disposed on an inner side surface of the frame.

The uneven surface of the frame may include a circular concave portion or a polygonal concave portion.

The control layer may be disposed on the second electrode with a shape of a closed curved surface in a plan view, and the control layer may include the uneven surface on an inner side surface and another uneven surface on an outer side surface of the frame.

The uneven surface of the frame may include at least one circular concave portion and at least one polygonal concave portion.

The control layer may further include a second frame arranged horizontally from the frame.

The control layer may further include a second frame arranged vertically from the frame.

The control layer may have a shape of a discontinuous curved surface having at least one opening, and the uneven surface may be disposed on an inner side surface of the frame.

The control layer may be disposed on the second electrode with an edge of the closed curved surface disposed along a periphery of the second electrode in a plan view, and a thickness, a height, or a width of a first area of the frame may differ from a thickness, a height, or a width of a second area of the frame disposed opposite to the first area.

The resonator may further include: a reflective layer configured to reflect an acoustic wave based on a signal applied to the first electrode and the second electrode.

The reflective layer may include: a first reflective layer disposed below the first electrode; and a second reflective layer disposed below the first reflective layer, the second reflective layer having a higher acoustic impedance than the first reflective layer.

In another general aspect, there is provided a resonator including: a first electrode disposed on a substrate, a portion of the first electrode spaced apart from the substrate; a piezoelectric layer disposed on the first electrode; a second electrode disposed on the piezoelectric layer; and a control layer disposed between the first electrode and the substrate and comprising an uneven surface.

The piezoelectric layer may be configured to convert energy input from the first electrode into an acoustic wave; and the control layer may be configured to control the acoustic wave.

The control layer may have a shape of a closed curved surface in a plan view, and the uneven surface may be disposed on an inner side surface of the control layer.

The uneven surface of the control layer may include a circular concave portion or a polygonal concave portion, and the uneven surface may be disposed on an outer side surface of the control layer.

The control layer may have a shape of a closed curved surface in a plan view; the uneven surface may be disposed on an inner side surface; and a second uneven surface may be disposed on an outer side surface of the control layer.

In another general aspect, there is provided a resonator including: a reflective layer disposed on a substrate; a first electrode disposed on the reflective layer; a piezoelectric layer disposed on the first electrode; a second electrode disposed on the piezoelectric layer; and a control layer disposed on the second electrode and comprising an uneven surface, in which the piezoelectric first electrode is configured to convert energy input from the first electrode into an acoustic wave, and the control layer is configured to control the acoustic wave.

The reflective layer may be configured to reflect the acoustic wave converted by the piezoelectric layer based on a signal applied to the first electrode and the second electrode; and the first electrode may be configured to input the energy to the piezoelectric layer based on the signal applied to the first electrode and the second electrode.

The control layer may have a shape of a closed curved surface in a plan view, and may include the uneven surface on an inner side surface.

The uneven surface of the control layer may include a circular concave portion or a polygonal concave portion, and the control layer may include another uneven surface on an outer side surface.

The control layer may have a shape of a closed curved surface in a plan view; and the uneven surface may be disposed an inner side surface; and another uneven surface may be disposed on an outer side surface of the control layer.

In another general aspect, there is provided a method of fabricating a resonator, the method involving: forming a piezoelectric layer on a first electrode; forming a second electrode on the piezoelectric layer; and forming a control layer on the second electrode, in which the control layer includes a frame with an uneven surface.

The general aspect of the method may further involve: forming the first electrode on a substrate before the forming of the piezoelectric layer on the first electrode.

The general aspect of the method may further involve: forming a reflective layer on a substrate and forming the first electrode on the reflective layer before the forming of the piezoelectric layer on the first electrode, in which the piezoelectric layer may be configured to convert an electrical energy input from the first electrode into an acoustic wave, and the control layer may be configured to control the acoustic wave.

Other features and aspects will be apparent from the following detailed description, the drawings, and the claims.

BRIEF DESCRIPTION OF THE DRAWINGS

FIG. 2A is a plan view of the resonator illustrated in FIG. 1.

Figure 1:
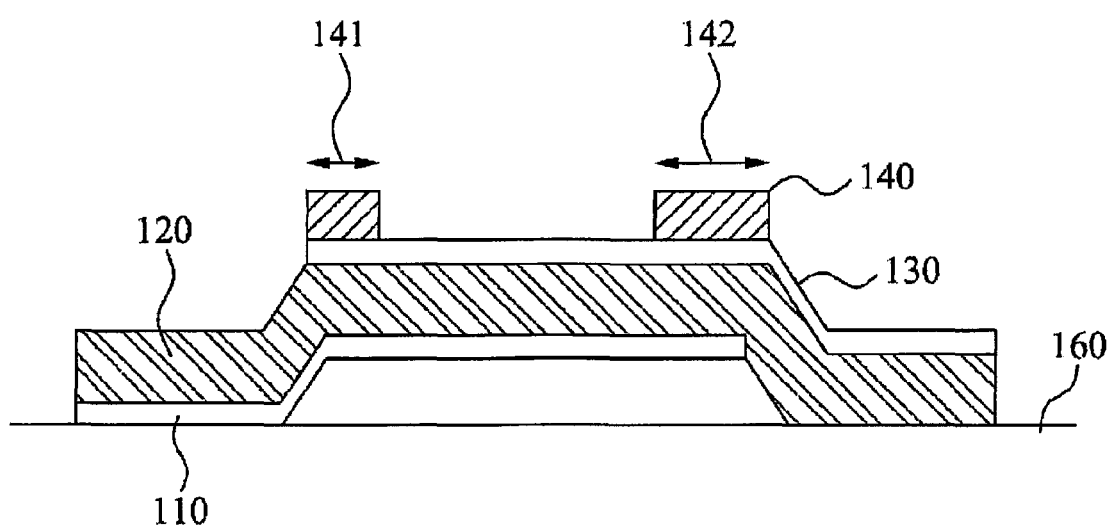
FIG. 1 is a cross-sectional view of an example of a resonator.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

FIG. 1 illustrates a cross-sectional view of an example of a resonator.

One example of a resonator according to the present disclosure may be implemented as, for example, a bulk acoustic wave resonator (BAWR) that oscillates at a predetermined frequency.

Referring to FIG. 1, the example of the resonator includes a first electrode 110, a piezoelectric layer 120, a second electrode 130, and a control layer 140.

In this example, the first electrode 110 corresponds to a lower electrode that is disposed below the piezoelectric layer 120. The first electrode 110 may be used to input an electrical energy to the piezoelectric layer 120. In one example, an air-gap cavity may be disposed at least a predetermined distance apart from a substrate 160 supporting the resonator to provide a resonance region between the first electrode 110 and the substrate 160.

Referring back to FIG. 1, the second electrode 130 corresponds to an upper electrode that is disposed on top of the piezoelectric layer 120. The second electrode 130 may be used to input an electrical energy to the piezoelectric layer 120.

The piezoelectric layer 120 may convert the electrical energy input from the first electrode 110 and the second electrode 130 into an acoustic wave. The piezoelectric layer 120 may be made from a piezoelectric material. The acoustic wave being converted by the piezoelectric layer 120 may comprise a longitudinal acoustic wave component and a transverse acoustic wave component.

The control layer 140 may be implemented as a frame having an uneven surface on the second electrode 130. The shape of the frame is illustrated in a plan view in FIG. 2A. The control layer 140 may be used to control or modulate the acoustic wave converted by the piezoelectric layer 120. For instance, the control layer 140 may reflect the transverse acoustic wave, which is not used in generating resonance, and may trap the transverse acoustic wave inside the resonator.

For example, the uneven surface of the frame may reflect the transverse acoustic wave that is not used because the cutoff frequency is low in the region where the frame is provided and the cutoff frequency is high in the region where the frame is not provided.

Referring to the example illustrated in FIG. 1, the frame of the control layer 140 may be formed by using processes such as depositing the material that forms the control layer 140 on the second electrode 130, patterning, and etching the material on the second electrode 130 to obtain the shape of the frame. For example, the control layer 140 may be formed by patterning at least one material consisting of molybdenum (Mo), ruthenium (Ru), gold (Au), silicon dioxide ($SiO_2$), and silicon nitride (SiN) on the second electrode 130, and performing an etching process thereafter.

The control layer 140 may have variable roughness on an upper surface, an inner surface, and/or an outer surface of the frame. For example, an effective value of roughness of an upper surface of the frame may be in a range of 1 nanometer (nm) and 300 micrometers ($\mu$m), and an effective value of roughness of a lower surface of the frame may be in a range of 0.1 nm and 3 $\mu$m.

In one example, the frame may have a shape of a closed curved surface with an outer edge of the surface disposed along a periphery of the resonator, and the frame may include at least one uneven surface on the inner side surface provided along an edge of a hole provided in a center of the closed curved surface. The uneven surface may be formed as a combination of at least one curved concave portion and at least one curved convex portion. The curved concave portions and the curved convex portions may be formed in alternating manner as to form the uneven surface.

A further description of the shape of an example of the frame is provided with reference to FIG. 2A.

Along the closed curved surface of the frame, a thickness, a height, and/or a width of one area may differ from a thickness, a height and/or a width of a second area positioned on an oppose side from the first area.

For example, in FIG. 1, an area of the control layer 140 that includes a curved concave portion is illustrated at the left side of the diagram with a width 141. At the right side of the diagram, an area of the control layer 140 that includes a curved convex portion is illustrated with a width 142. In this example, the width 141 of the first area of the frame disposed at the left side of the control layer 140 is less than a width 142 of an area of the frame disposed at the right side of the control layer 140. The cross-sectional view illustrated in FIG. 1 corresponds to a view of the resonator obtained along line 230 of FIG. 2A.

The resonator illustrated in FIG. 2A may reflect an outward propagating transverse acoustic wave into the inside of the resonator by using an uneven or irregular surface of the frame to prevent an energy loss of the acoustic wave. That is, because the reflected transverse acoustic wave may reduce the energy loss, the resonator may ensure a high Q-factor and a high electromechanical coupling coefficient kt2.

A high Q-factor may improve a bandwidth filtering characteristic in the implementation of a filter or a duplexer. A high kt2 may increase a bandwidth and may improve an amount and a speed of data transfer during transmission and reception.

FIG. 2A illustrates a plan view of the resonator illustrated in FIG. 1.

Referring to FIG. 2A, the control layer 140 of the resonator may include a frame formed in a shape of a closed curved surface in its plan view with its outer edge along a periphery of the second electrode 130. A closed curved surface shape refers to a two dimensional shape formed with a curved line or a line having curved portion and a straight portion with the starting point of the line meeting the ending point of the line as to form a closed shape. In this example, the overall shape of the closed curved surface is a donut shape with a central hole having rough edges. In this instance, the frame may include at least one uneven portion 200 on the surface of the inner side wall of the closed curved surface.

The uneven portion 200 may be formed by combining a curved convex portion 210 and a curved concave portion 220. The curved convex portion 210 may have an internal angle of 180 degrees or less, and the curved concave portion 220 may have an external angle of 180 degrees or more, forming an arc-like shape in its cross-section. However, the shape of the curvature is not limited thereto.

A line 230 illustrated in FIG. 2A indicates a cutting plane along which the cross-sectional view of FIG. 1 is obtained. When viewed along the line 230, an area of the frame at the left side and taken along the line 230 corresponds to a curved concave portion of the frame; thus, the frame may have a relatively narrower width. Also, an area of the frame the right side and taken along the line 230 corresponds to a curved convex portion of the frame. Accordingly, the area of the frame illustrated at the right side has a relatively wider width, in comparison to the area of the frame illustrated at the left side. Accordingly, in FIG. 1, the width of the area of the frame disposed at the left side is less than the width of the area of the frame disposed at the right side.

Figure 2B:
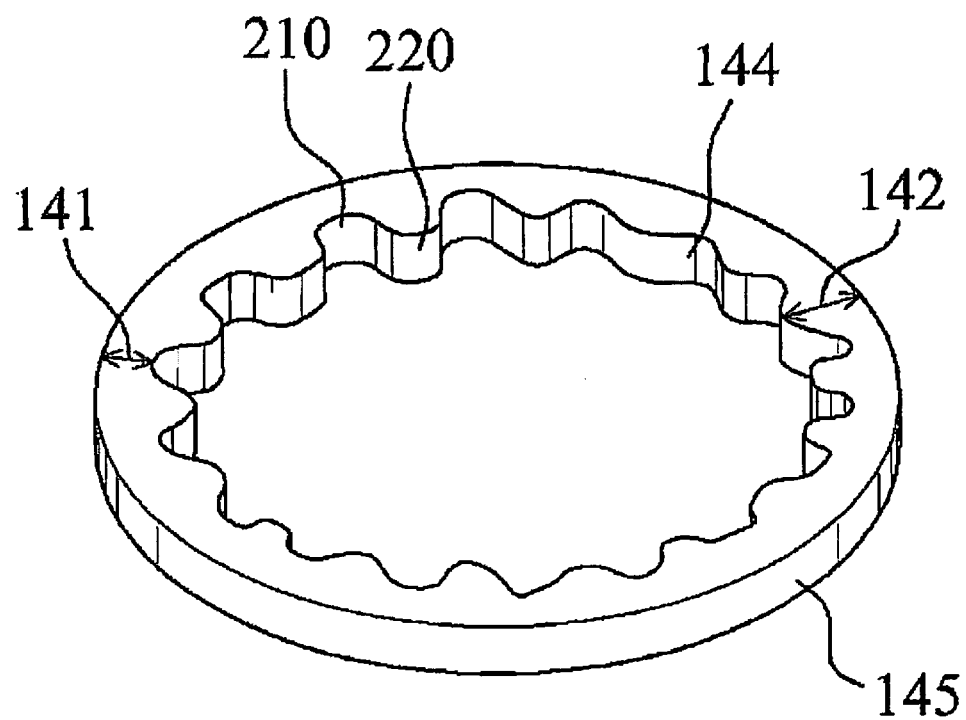
FIG. 2B is a perspective view of a control layer of the resonator illustrated in FIG. 1.

FIG. 2B illustrates a perspective view of the control layer 140. In this example, the frame includes an inner side surface 144 and an outer side surface 145 that are formed perpendicular to the upper surface having a shape of a closed curved surface. The inner side surface 144 is an uneven surface having a plurality of convex portions 220 and concave portions 210. In this example, the outer side surface 145 is smooth with constant curvature without the unevenness of the inner side surface 220. However, in other examples, the shape of the control layer may vary. Further, in other examples, the uneven surface may be located on the outer side surface 145 as well as the inner side surface 145.

Figure 3A:
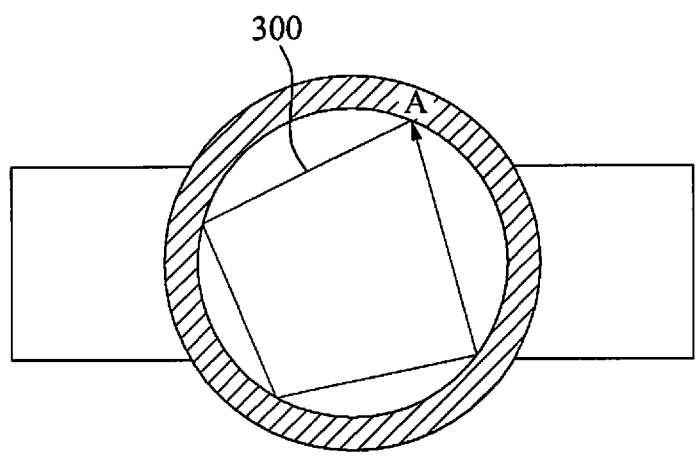
FIG. 3A is a plan view of a resonator.
Figure 3B:
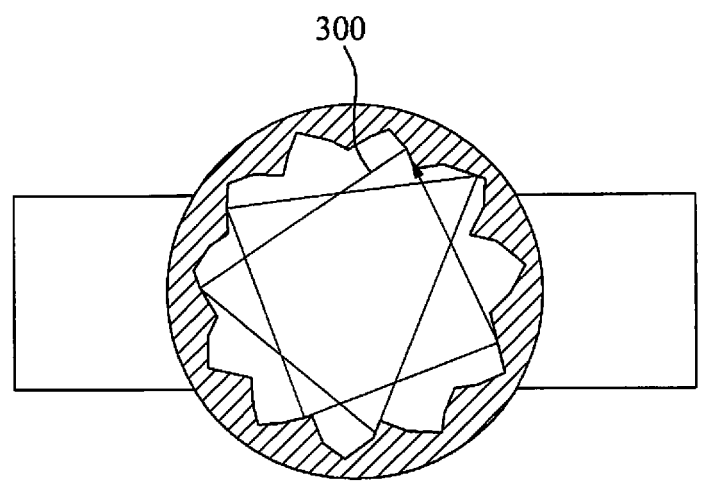
FIG. 3B is a plan view of an example of a resonator for explaining an operation thereof.

FIG. 3A illustrates a plan view of a resonator according to a conventional device. FIG. 3B is a plan view of an example of a resonator according to the present disclosure. FIG. 3B illustrates the mode of operation of the resonator.

FIG. 3A illustrates an example of a path of travel of a reflected transverse acoustic wave in a conventional resonator. FIG. 3B illustrates an example of a path of travel of a reflected transverse acoustic wave in a resonator according to the present disclosure.

The conventional resonator may include a frame having an inner hole with a shape corresponding to a shape of the outer edge of the resonator. Accordingly, in the illustrated resonator, there is a high probability that a transverse acoustic wave 300 reflected by the frame will travel around the inside of the frame and will return to an original location A. In this example, the inner edge and outer edge have a circular shape. In this instance, the transverse acoustic wave 300 may be reflected only along a path shown in FIG. 3A in a repetitive manner, resulting in an increased probability of a spurious resonance occurring in frequencies other than a resonant frequency. Herein, the spurious resonance may refer to small resonances occurring in frequencies other than a resonant frequency.

However, the example of the resonator illustrated in FIG. 3B includes an irregular-shaped frame having an uneven surface on an inner side of the frame. In this example, the probability that a transverse acoustic wave 300 reflected by the frame will travel around the inside of the frame and will return to an original location is low. That is, the transverse acoustic wave 300 may be reflected at various angles due to the uneven portion, which may increase a length of a path of reflection of the transverse acoustic wave 300 and may trap energy that corresponds to the transverse acoustic wave 300 inside the resonator.

In one example of a resonator according to the present disclosure, a size, a shape, and/or a number of uneven portions formed along the uneven portion on the inner surface of the frame may be determined based on the length of the path of reflection of the transverse acoustic wave 300.

That is, due to the presence of the frame with high irregularity, the resonator illustrated in FIG. 2A may suppress a spurious resonance and consequently reduce a pass-band ripple when fabricating a filter or duplexer.

Figure 4:
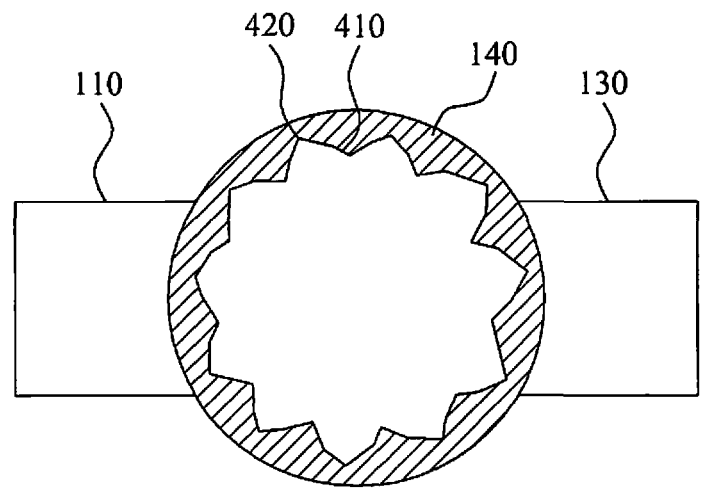
FIG. 4 is a plan view of another example of a resonator.

FIG. 4 is a plan view of another example of a resonator.

Referring to FIG. 4, the resonator includes a frame formed in a shape of a closed curved surface with its outer edge along a periphery of the resonator. In this example, the inner side of the frame along an inner edge of the closed curved surface of the frame may include a plurality of triangular convex portions 410, and a plurality of triangular concave portions 420 formed in an alternating manner to maximize the irregularity of the inner side surface.

However, various modifications may be made to the triangular shape of the uneven portions 410 and 420. For example, in another example, a polygonal shape including, but not limited to, a rectangular shape, a pentagonal shape, and the like may be used to form the concave and convex portions. Accordingly, the frame may include uneven portions of different polygonal shapes on the inner surface of the closed curved surface. For example, the frame may include a triangular convex portion, a rectangular convex portion, and a pentagonal convex portion, and a triangular concave portion, a rectangular concave portion, and a pentagonal concave portion. Further, in other examples, irregular protrusions or other uneven shapes may be provided in the uneven surface.

Also, the frame may include a curved convex portion and a curved concave portion as shown in FIG. 2A and a triangular convex portion and a triangular concave portion as shown in FIG. 4.

Figure 5:
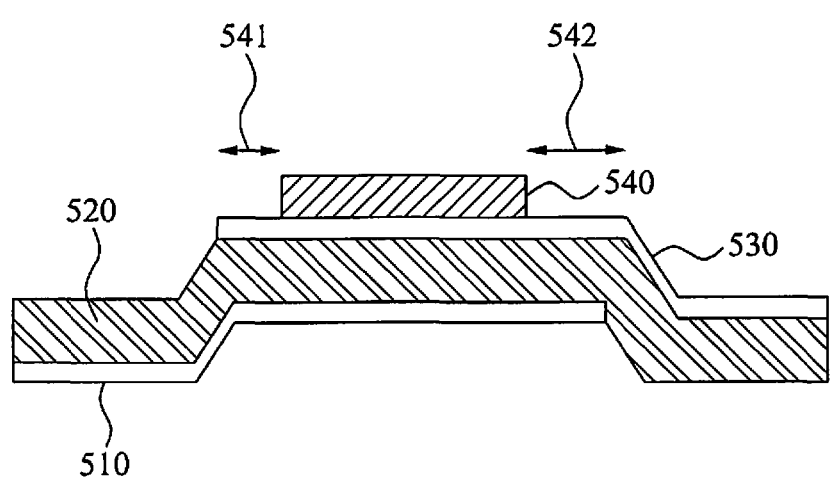
FIG. 5 is a cross-sectional view of another example of a resonator.

FIG. 5 illustrates a cross-sectional view of another example of a resonator according to the present disclosure.

In the example of the resonator illustrated in FIG. 5, a control layer is disposed at the center of the second electrode.

Referring to the example illustrated in FIG. 5, the resonator includes a first electrode 510, a piezoelectric layer 520, a second electrode 530, and a control layer 540. The first electrode 510, the piezoelectric layer 520, and the second electrode 530 have the same configuration and operation as those of the first electrode 110, the piezoelectric layer 120, and the second electrode 130 illustrated in FIG. 1, and a detailed description thereof is omitted herein for conciseness.

The control layer 540 may include an irregular-shaped frame on the second electrode 530 to control an acoustic wave converted by the piezoelectric layer 520. In this instance, the frame may be formed in a shape of a circle or a polygon, and may include at least one uneven portion on an outer side surface thereof. The uneven portion may be formed of a combination of at least one curved concave portion and at least one curved convex portion.

Figure 6:
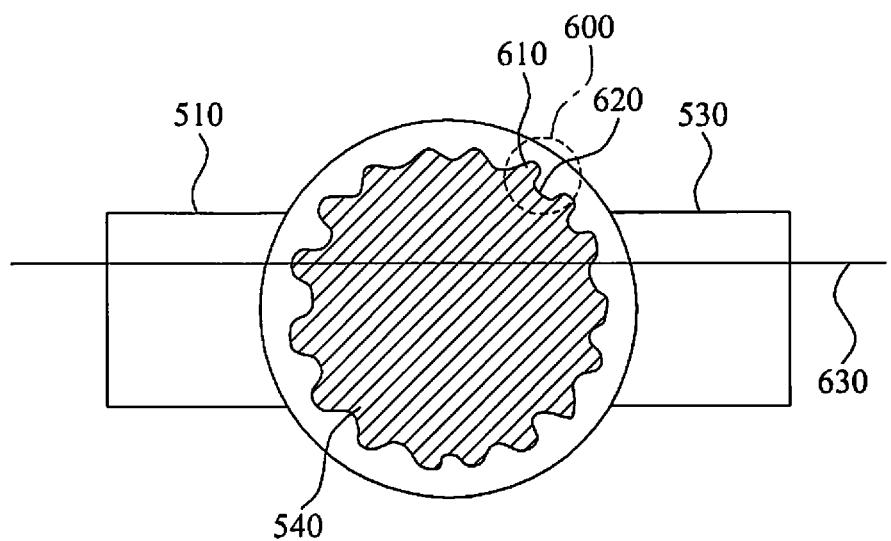
FIG. 6 is a plan view of the resonator illustrated in FIG. 5.

A further detailed description of the shape of the frame is provided with reference to FIG. 6.

Referring to FIG. 5, in a case of a curved convex portion at the left side of the second electrode 530 and a curved concave portion at the right side of the second electrode 530, the frame may occupy a wider area at the left side of the second electrode 530. Accordingly, a width 541 of an area unoccupied by the frame at the left side of the second electrode 530 may be less than a width 542 of an area unoccupied by the frame at the right side of the second electrode 530.

The resonator according to this example may maximize a path of reflection of a transverse acoustic wave by forming the irregular-shaped frame on the second electrode.

FIG. 6 is a plan view of the resonator illustrated in FIG. 5.

The resonator illustrated in FIG. 6 includes the control layer 540 disposed on the second electrode 530 at the center of the second electrode 530, and the control layer 540 may include at least one uneven portion 600 on an outer side surface thereof.

The uneven portion 600 may be formed as a combination of a curved convex portion 610 and a curved concave portion 620. The curved convex portion 610 may have an internal angle of 180 degrees or less, and the curved concave portion 620 may have an external angle of 180 degrees or more.

A line 630 indicates a cutting plane line along which a cross-sectional view of FIG. 5 is obtained. When viewed along the line 630, because a left area of the frame corresponds to a curved convex portion, a width of an area unoccupied by the frame at the left side of the second electrode 530 may be less than a width of an area unoccupied by the frame corresponding to a curved concave portion. Also, because a right area of the frame corresponds to a curved concave portion when viewed along the line 630, a width of an area unoccupied by the frame at the right side of the second electrode 530 may be greater than a width of an area unoccupied by the frame at the left side of the second electrode 530.

Figure 7:
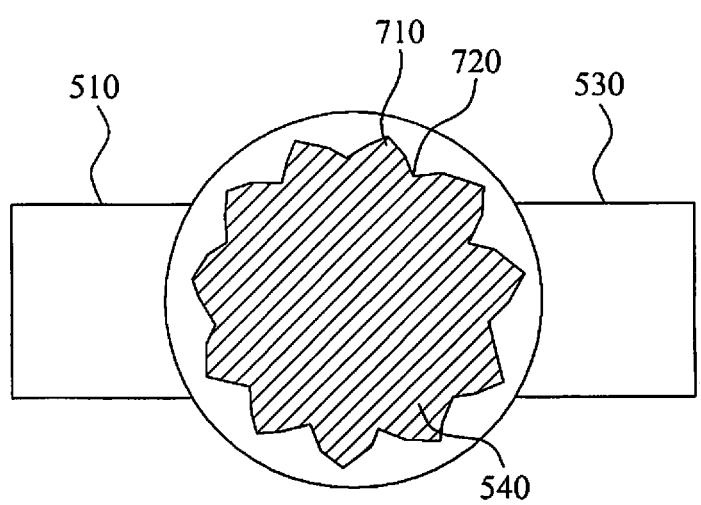
FIG. 7 is a plan view of yet another example of a resonator.

FIG. 7 is a plan view of another example of a resonator.

The control layer 540 of the resonator illustrated in FIG. 7 includes a frame having triangular convex portions 710 and triangular concave portions 720 formed on an outer side surface to maximize the irregularity of the outer side surface.

However, the triangular shape is provided only as one example, and various modifications may be made to the triangular shape of the uneven portions 710 and 720. For example, other polygonal shapes, including but not limited to a rectangular shape, a pentagonal shape, and the like may be used to form uneven portions on the outer side surface of the frame. Further, in other examples, the frame may include a combination of different shaped convex and concave portions on the outer side surface. For example, the frame may include a triangular convex portion, a rectangular convex portion, and a pentagonal convex portion, and a triangular concave portion, a rectangular concave portion, and a pentagonal concave portion.

Also, the frame may include a curved convex portion and a curved concave portion as shown in FIG. 6 and a triangular convex portion and a triangular concave portion as shown in FIG. 7.

Figure 8:
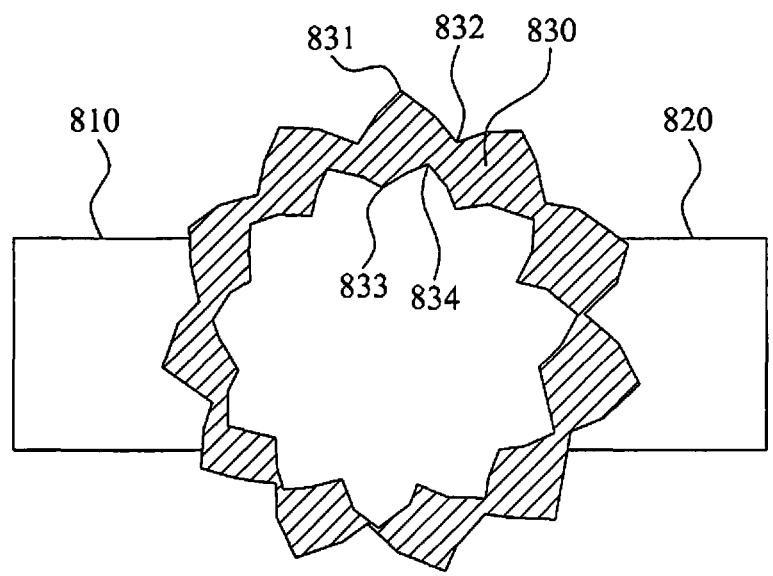
FIG. 8 is a plan view of yet another example of a resonator.

FIG. 8 is a plan view of yet another example of a resonator.

In FIG. 8, the resonator is illustrated as including a frame having an uneven portion formed on an inner side surface and on an outer side surface.

Referring to the example illustrated in FIG. 8, the control layer of the resonator includes a frame 830 formed in a shape of a closed curved surface with its outer edge along a periphery of the resonator. In this instance, the frame 830 may include triangular convex portions 831 and triangular concave portions 832 on an outer side surface of the closed curved surface, and triangular convex portions 833 and triangular concave portions 834 on an inner side surface of the closed curved surface of the control layer.

However, the shapes of the convex and concave portions are provided only as an example, and various modifications may be made to the triangular shape of the uneven portions 831, 832, 833, and 834. For example, a polygonal shape, including but not limited to, a rectangular shape, a pentagonal shape, and the like may be used in other examples. Further, the frame 830 may include uneven portions of different polygonal shapes on the outer side surface and on the inner side surface of the closed curved surface. For example, the frame 830 may include a triangular convex portion, a rectangular convex portion, and a pentagonal convex portion, and a triangular concave portion, a rectangular concave portion, and a pentagonal concave portion on the outer side surface of the closed curved surface of the frame. Also, the frame 830 may include a triangular convex portion, a rectangular convex portion, and a pentagonal convex portion, and a triangular concave portion, a rectangular concave portion, and a pentagonal concave portion on the inner side surface of the closed curved surface of the frame.

The frame 830 may include a curved convex portion and a curved concave portion on the outer side surface and on the inner side surface. Also, the frame 830 may include a curved convex portion, a curved concave portion, a polygonal convex portion, and a polygonal concave portion on the outer side surface and on the inner side surface of the frame.

Figure 9:
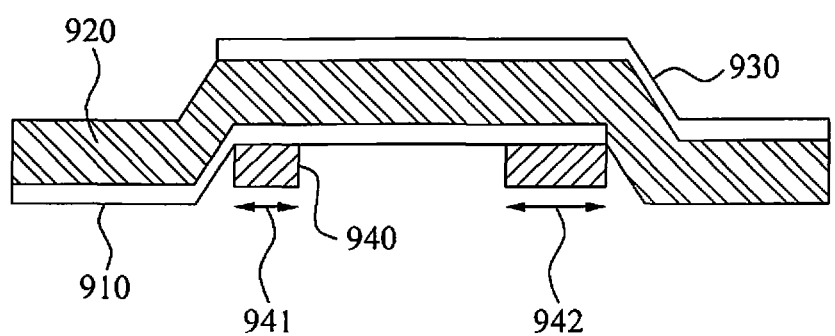
FIG. 9 is a cross-sectional view of yet another example of a resonator.

FIG. 9 illustrates a cross-sectional view of yet another example of a resonator.

In the example illustrated in FIG. 9, the resonator includes a control layer that is disposed below a first electrode.

Referring to FIG. 9, the resonator may include the first electrode 910, a piezoelectric layer 920, a second electrode 930, and the control layer 940. The first electrode 910, the piezoelectric layer 920, and the second electrode 930 have the same configuration and operation as those of the first electrode 110, the piezoelectric layer 120, and the second electrode 130 of FIG. 1; thus, a detailed description thereof is omitted herein for conciseness.

The control layer 940 is implemented as an irregular-shaped frame positioned below the first electrode 930. The control layer 940 is configured to control an acoustic wave converted by the piezoelectric layer 920. The control layer 940 may reflect a transverse acoustic wave of the acoustic wave that is not used in generating resonance by using the frame to trap the transverse acoustic wave inside the resonator.

The control layer 940 may be obtained by depositing a layer under the first electrode 910, patterning the layer, and etching the layer under the first electrode 910 to obtain the desired shape of the frame below the first electrode 910. For example, the control layer 940 may be formed by patterning at least one material of Mo, Ru, Au, SiO$_2$, and SiN below the first electrode 910, and then performing an etching process using the pattern.

Also, the frame may be formed in a shape of a closed curved surface along a periphery of the first electrode 910, and may include at least one uneven portion on the inner side surface of the closed curve surface. In this example, the uneven portion may be formed as a combination of at least one curved concave portion and at least one curved convex portion. Also, the shape of the frame may correspond to one of the shapes of the frames of FIGS. 2, 4, and 8.

Along the closed curve surface of the frame, an area of the frame may have a different thickness, a different height, and/ or a different width in comparison to another area of the frame positioned on an opposite side from the first area.

For example, in FIG. 9, the area including a curved concave portion at the left side of the control layer 940 and the area including a curved convex portion at the right side of the control layer 940 have different widths from each other. In FIG. 9, a width 941 of an area of the frame disposed at the left side of the control layer 940 is less than a width 942 of an area of the frame disposed at the right side of the control layer 940.

The illustrated example of resonator may maximize a path of reflection of a transverse acoustic wave by forming the irregular-shaped frame below the first electrode.

Figure 10:
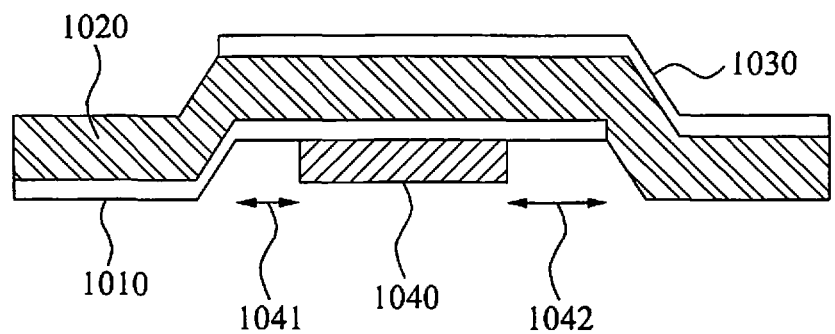
FIG. 10 is a cross-sectional view of yet another example of a resonator.

FIG. 10 is a cross-sectional view of yet another example of a resonator.

Referring to the example illustrated in FIG. 10, the resonator includes a control layer that is disposed below a first electrode at the center of the first electrode.

Referring to FIG. 10, the resonator includes a first electrode 1010, a piezoelectric layer 1020, a second electrode 1030, and a control layer 1040. The first electrode 1010, the piezoelectric layer 1020, and the second electrode 1030 have the same configuration and operation as those of the first electrode 110, the piezoelectric layer 120, and the second electrode 130 of FIG. 1; thus, a detailed description thereof is omitted herein for conciseness.

The control layer 1040 may include an irregular-shaped frame below the first electrode 1030 to control an acoustic wave converted by the piezoelectric layer 1020. In this example, the frame may be formed in a shape of a circle or a polygon, and may include at least one uneven portion on an outer side surface. The uneven portion may be formed of a combination of at least one curved concave portion and at least one curved convex portion. Also, the shape of the frame may correspond to one of the shapes of the frames of FIGS. 6 and 7.

As illustrated in FIG. 10, an area of the frame includes a curved convex portion at the left side of the first electrode 1010 and a curved concave portion at the right side of the first electrode 1010. Thus, the frame occupies a wider area at the left side of the first electrode 1010 than the right side of the first electrode 1010. Accordingly, a width 1041 of an area unoccupied by the frame at the left side of the first electrode 1010 is less than a width 1042 of an area unoccupied by the frame at the right side of the first electrode 1010.

The illustrated example of resonator may maximize a path of reflection of a transverse acoustic wave by forming the irregular-shaped frame below the first electrode.

Figure 11:
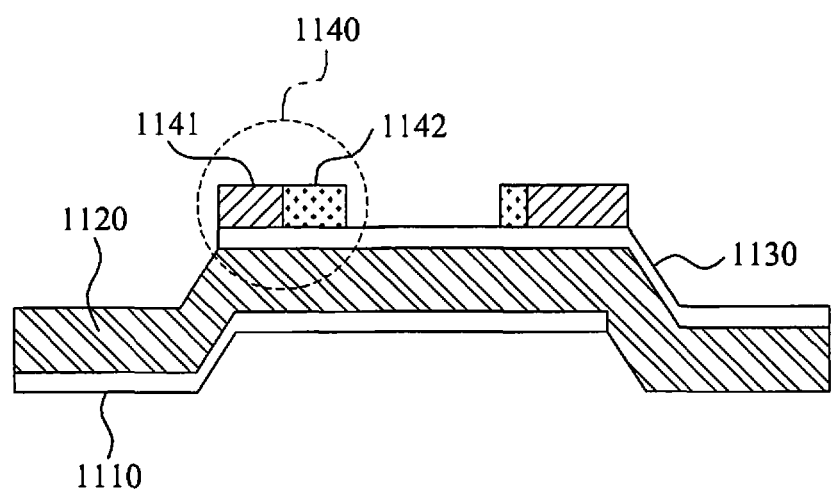
FIG. 11 is a cross-sectional view of another example of a resonator.

FIG. 11 is a cross-sectional view of another example of a resonator.

Referring to FIG. 11, the resonator includes a control layer having a plurality of frames arranged in a horizontal direction.

The resonator includes a first electrode 1110, a piezoelectric layer 1120, a second electrode 1130, and a control layer 1140. The first electrode 1110, the piezoelectric layer 1120, and the second electrode 1130 have the same configuration and operation as those of the first electrode 110, the piezoelectric layer 120, and the second electrode 130 of FIG. 1; thus, a detailed description thereof is omitted herein for conciseness and ease of description.

Referring to FIG. 11, the control layer 1140 includes an irregular-shaped first frame 1141 and an irregular-shaped second frame 1142 on the second electrode 1130 to control an acoustic wave converted by the piezoelectric layer 1020. A further description of the shape of the first frame 1141 and the second frame 1142 is provided with reference to FIG. 12.

In this example, the first frame 1141 and the second frame 1142 may be formed in a shape of a closed curved surface on the second electrode 1030 along a periphery of the second electrode 1030. The first frame 1141 and the second frame 1142 may include at least one uneven portion on the inner side surface and the outer side surface of the closed curved surface. The uneven portion may be formed of a combination of at least one curved concave portion and at least one curved convex portion.

Along the closed curved surface of the first frame 1141 and the second frame 1142, an area of the frames 1141 and 1142 may differ in at least one of a thickness, a height, and a width with another area of the frames 1141 and 1142 that is positioned opposite from the first area.

For example, a width of the first frame 1141 at the left side may be less than a width of the first frame 1141 at the right side. In contrast, a width of the second frame 1142 at the left side may be greater than a width of the second frame 1142 at the right side. That is, a path of reflection of a transverse acoustic wave may be maximized by making the widths of the first frame 1141 and the second frame 1142 included in the control layer 1140 different, despite having the same width of the control layer 1140.

In addition to the first frame 1141 and the second frame 1142, the control layer 1140 may further include at least one additional frame.

Figure 12:
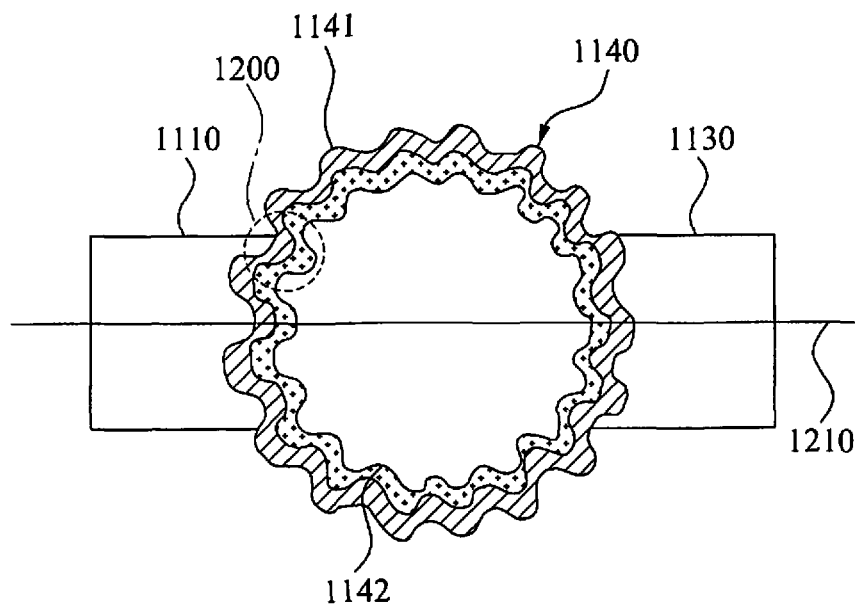
FIG. 12 is a plan view of the resonator of FIG. 11.

FIG. 12 is a plan view of the resonator illustrated in FIG. 11.

Referring to FIG. 12, the control layer 1140 of the resonator includes the first frame 1141 and the second frame 1142 formed in a shape of a closed curved surface along a periphery of the second electrode 1130. In the illustrated example, the first frame 1141 and the second frame 1142 include at least one uneven portion 1200 on both the inner side surface and on the outer side surface of each of the frames 1141 and 1142. Also, the uneven portion of the first frame 1141 and the uneven portion of the second frame 1142 may have a different location, a different size, and a different number of uneven portions, entirely or partially.

The uneven portion 1200 may be formed of a combination of a curved concave portion and a curved convex portion. The curved convex portion may have an internal angle of 180 degrees or less, and the curved concave portion may have an external angle of 180 degrees or more.

A line 1210 indicates a cutting plane line along which the cross-sectional view of FIG. 11 is obtained.

Figure 13:
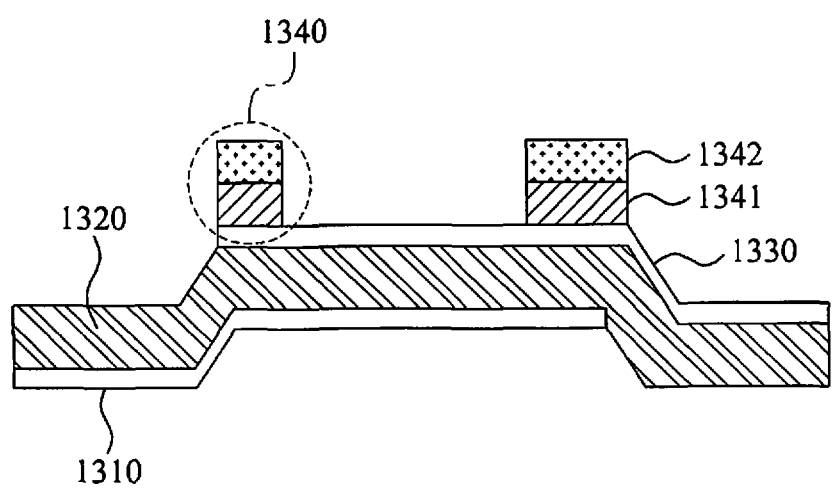
FIG. 13 is a cross-sectional view of another example of a resonator.

FIG. 13 is a cross-sectional view of another example of a resonator.

According to the example of the resonator illustrated in FIG. 13, a control layer includes a plurality of frames that are arranged in a vertical direction of the resonator.

Referring to FIG. 13, the example of the resonator includes a first electrode 1310, a piezoelectric layer 1320, a second electrode 1330, and a control layer 1340. The first electrode 1310, the piezoelectric layer 1320, and the second electrode 1330 have the same configuration and operation as those of the first electrode 110, the piezoelectric layer 120, and the second electrode 130 of FIG. 1, thus, a detailed description thereof is omitted herein for conciseness.

The control layer 1340 may include an irregular-shaped first frame 1341 on the second electrode 1330 and an irregular-shaped second frame 1342 on the first frame 1341 to control an acoustic wave converted by the piezoelectric layer 1320.

In this example, the first frame 1341 and the second frame 1342 are formed in a shape of a closed curved surface on the second electrode 1330 along a periphery of the second electrode 1330. The first frame 1341 and the second frame 1342 may each include at least one uneven portion on the inner side surface of the closed curved surface. The uneven portion may be formed of a combination of at least one curved concave portion and at least one curved convex portion.

Along the closed curved surface of the first frame 1341 and the second frame 1342, an area of the frame has a thickness, a height, and/or a width that is different from a thickness, a height and/or a width of an area positioned opposite from the first area.

Referring to FIG. 13, an area of the control layer 1340 corresponding to a curved convex portion is positioned at the left side of the control layer 1340, and an area of the control layer 1340 corresponding to a curved concave portion is positioned at the right side of the control layer 1340. In FIG. 13, a width of the first frame 1341 and the second frame 1342 disposed at the left side is less than a width of the first frame 1341 and the second frame 1342 disposed at the right side.

In addition to the first frame 1341 and the second frame 1342, the control layer 1340 may further include at least one additional frame, either in a horizontal direction or a vertical direction.

Figure 14:
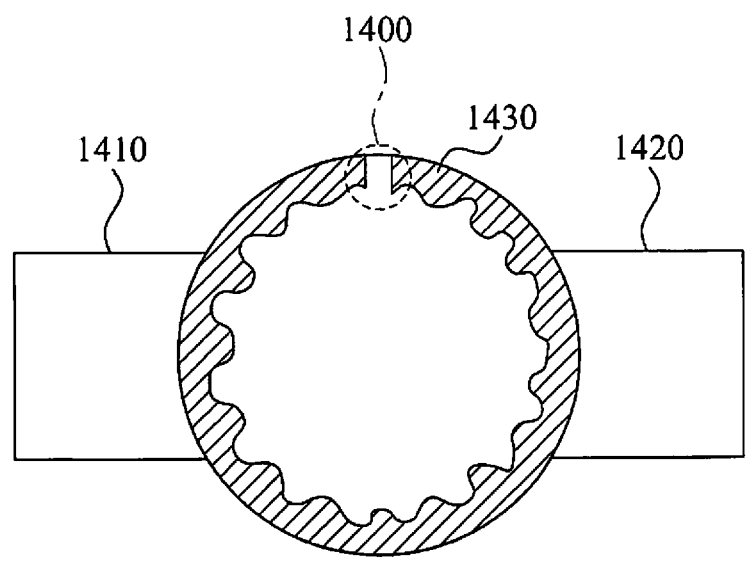
FIG. 14 is a plan view of another example of a resonator.

FIG. 14 is a plan view of another example of a resonator.

Referring to the example illustrated in FIG. 14, the resonator includes a control layer 1430, and the control layer 1430 is implemented as a frame having a shape of a closed curved surface along the periphery of a second electrode 1420. In this instance, a first electrode 1410 may be disposed below a piezoelectric layer, and the piezoelectric layer may be disposed below the second electrode 1420.

In this example, the frame may be formed in a shape of a discontinuous closed curved surface having at least one opening 1400. The frame also includes at least one uneven portion on the inner side surface of the discontinuous closed curved surface. The uneven portion may include a combination of a curved concave portion and a curved convex portion. The curved convex portion may have an internal angle of 180 degrees or less, and the curved concave portion may have an external angle of 180 degrees or more.

Figure 15:
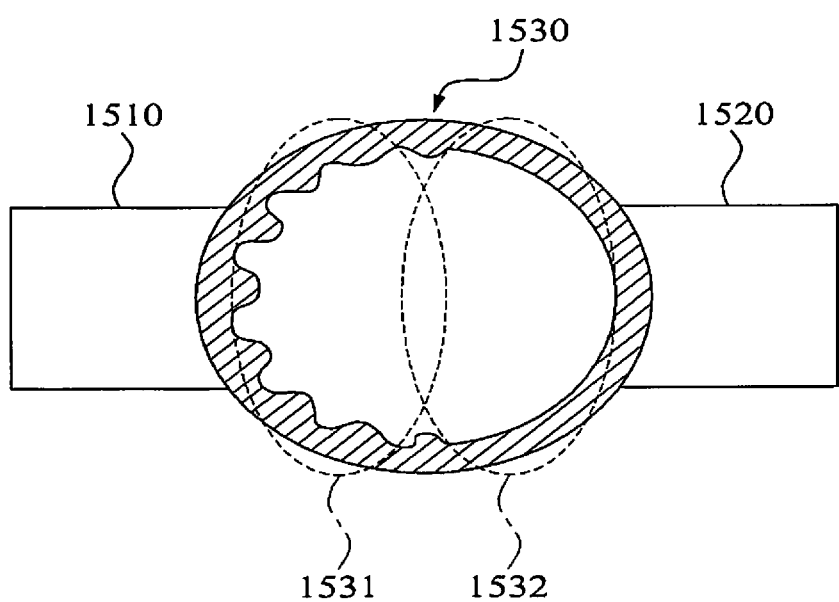
FIG. 15 is a plan view of another example of a resonator.

FIG. 15 is a plan view illustrating another example of a resonator.

Referring to the example illustrated in FIG. 15, the resonator may include a control layer 1530. The control layer 1530 may include a frame formed in a shape of a closed curved surface along a periphery of a second electrode 1520. In this example, a first electrode 1510 may be disposed below a piezoelectric layer, and the piezoelectric layer may be disposed below the second electrode 1520.

In this example, the frame may include a first area 1531 with at least one uneven portion and a second area 1532 without an uneven portion. The uneven portion may include a combination of at least one curved concave portion and at least one curved convex portion. The curved convex portion may have an internal angle of 180 degrees or less, and the curved concave portion may have an external angle of 180 degrees or more.

Figure 16:
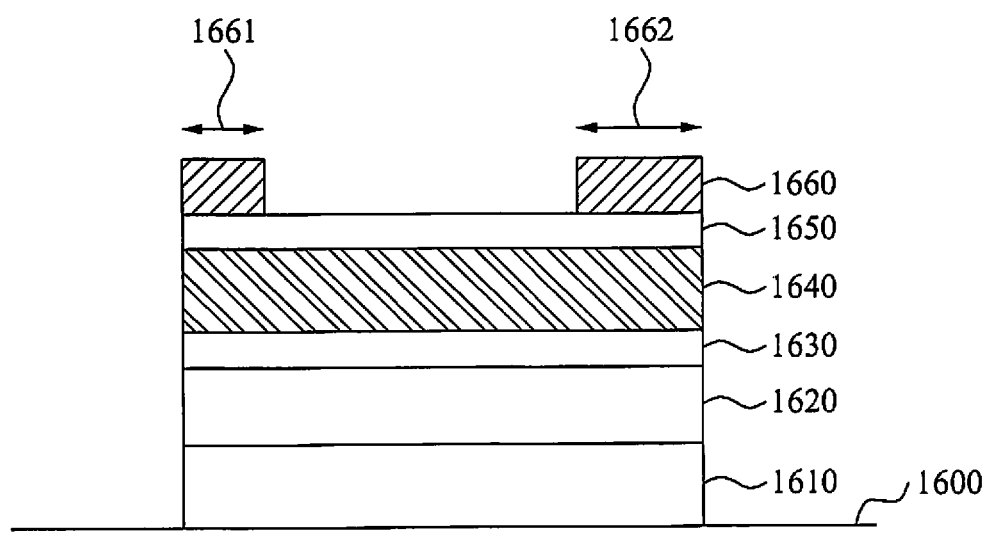
FIG. 16 is a cross-sectional view of another example of a resonator.

FIG. 16 is a cross-sectional view of another example of a resonator.

The example of the resonator according to FIG. 16 may correspond to a Bragg reflector-type BAW resonator.

Referring to FIG. 16, the resonator includes a second reflective layer 1610, a first reflective layer 1620, a first electrode 1630, a piezoelectric layer 1640, a second electrode 1650, and a control layer 1660. The first electrode 1630, piezoelectric layer 1640, and the second electrode 1650 have the same configuration and operation as those of the first electrode 110, the piezoelectric layer 120, and the second electrode 130 of FIG. 1; thus, a detailed description thereof is omitted herein for conciseness of description.

The first reflective layer 1620 and the second reflective layer 1610 may be disposed on a substrate 1600 to reflect an acoustic wave converted by the piezoelectric layer 1640 based on a signal applied to the first electrode 1630 and the second electrode 1650.

In particular, the second reflective layer 1610 may be disposed on the substrate 1600 and may have a relatively higher acoustic impedance than that of the first reflective layer 1620.

The first reflective layer 1620 may be provided on the second reflective layer 1610 and may have a relatively lower acoustic impedance than that of the second reflective layer 1610.

Although the illustrated example of resonator include the first reflective layer 1620 and the second reflective layer 1610, the resonator according to another example may further include at least one additional reflective layer between the first reflective layer 1620 and the second reflective layer 1610. That is, the resonator may include three reflective layers.

The control layer 1660 may be implemented as an irregular-shaped frame on the second electrode 1650 to control an acoustic wave converted by the piezoelectric layer 1650. The control layer 1660 may reflect the transverse acoustic wave that is not used in generating resonance by using the frame to trap the transverse acoustic wave inside the resonator.

In this instance, the control layer 1660 may be formed by depositing a layer on the second electrode, patterning the layer by forming a pattern, and etching the layer on the second electrode 1650 to obtain the desired shape of the frame. For example, the control layer 1660 may be formed by patterning at least one material of Mo, Ru, Au, $SiO_2$, and SiN on the second electrode 1650, followed by an etching process.

The frame may be formed in a shape of a closed curved surface on the second electrode 1650 along a periphery of the second electrode 1650, and may include at least one uneven portion on the inner side surface of the closed curved surface. In this instance, the uneven portion may include a combination of at least one curved concave portion and at least one curved convex portion.

Also, the shape of the frame may correspond to one of the shapes of the frames of FIGS. 2, 4, and 8.

Along the closed curved surface of the frame, one area of the frame may have different thickness, height, and/or width in comparison to another area of the frame positioned opposite from the first area.

Referring to FIG. 16, the area of the frame including a curved concave portion is positioned at the left side of the control layer 1660, and the area of the frame including a curved convex portion is positioned at the right side of the control layer 1660. A width 1661 of the first area of the frame disposed at the left side of the control layer 1660 is less than a width 1662 of the second area of the frame disposed at the right side of the control layer 1660.

Figure 17:
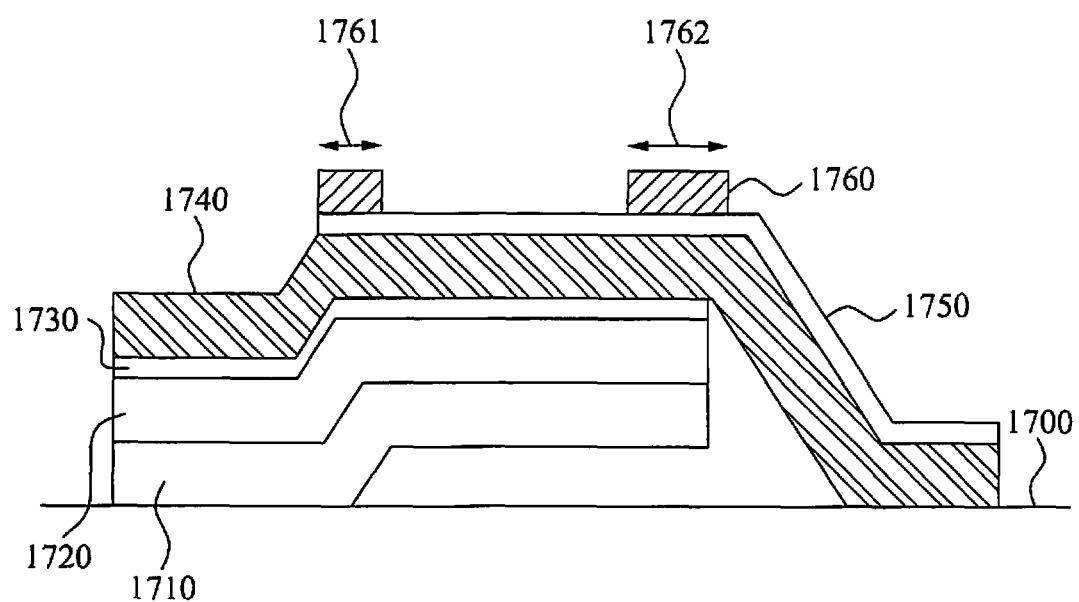
FIG. 17 is a cross-sectional view of another example of a resonator.

FIG. 17 illustrates a cross-sectional view of yet another example of a resonator.

The example of resonator illustrated in FIG. 17 may correspond to a Bragg reflector-type BAW resonator having an air-gap cavity.

Referring to FIG. 17, the resonator includes a second reflective layer 1710, a first reflective layer 1720, a first electrode 1730, a piezoelectric layer 1740, a second electrode 1750, and a control layer 1760. The first electrode 1730, the piezoelectric layer 1740, and the second electrode 1750 have the same configuration and operation as those of the first electrode 110, the piezoelectric layer 120, and the second electrode 130 of FIG. 1; thus, a detailed description thereof is omitted herein for conciseness.

The first reflective layer 1720 and the second reflective layer 1710 may be disposed on a substrate 1700 to reflect an acoustic wave converted by the piezoelectric layer 1740 based on a signal applied to the first electrode 1730 and the second electrode 1750. The region of the second reflective layer 1720 that provides resonance may be disposed at least a predetermined distance away from the substrate 1700 that supports the resonator, so as to provide an air-gap cavity between the substrate 1700 and the second reflective layer 1710.

Referring FIG. 17, the second reflective layer 1710 may be disposed on the substrate 1700 and may have a relatively higher acoustic impedance than that of the first reflective layer 1720.

The first reflective layer 1720 may be disposed on the second reflective layer 1710 and may have a relatively lower acoustic impedance than that of the second reflective layer 1710.

Although this example of resonator includes the first reflective layer 1720 and the second reflective layer 1710, in another example, the resonator may further include at least one additional reflective layer between the first reflective layer 1720 and the second reflective layer 1710. That is, the resonator may include three or more reflective layers.

The control layer 1760 may include an irregular-shaped frame on the second electrode 1750 to control an acoustic wave converted by the piezoelectric layer 1750. The control layer 1760 may reflect the transverse acoustic wave that is not used in generating resonance by using the frame to trap the transverse acoustic wave inside the resonator.

In this example, the control layer 1760 may be formed by depositing a layer on the second electrode, patterning the layer, and etching the layer to a desired shape to form the frame on the second electrode 1750. For example, the control layer 1760 may be formed by patterning at least one material of Mo, Ru, Au, $SiO_2$, and SiN on the second electrode 1750, and then performing an etching process.

The frame may be formed in a shape of a closed curved surface on the second electrode 1750 along a periphery of the second electrode 1750, and may include at least one uneven portion on the inner side surface of the closed curved surface. In this instance, the uneven portion may include a combination of at least one curved concave portion and at least one curved convex portion.

Also, the shape of the frame may correspond to one of the shapes of the frames of FIGS. 2, 4, and 8.

Along the closed curved surface of the frame, an area of the frame may have a thickness, a height, and/or a width that differs from a thickness, a height, and/or a width of an area positioned opposite to the first area.

For example, in FIG. 17, an area of the frame including a curved concave portion is positioned at the left side of the control layer 1760, and an area of the frame including a curved convex portion is positioned at the right side of the control layer 1760. In FIG. 17, a width 1761 of an area of the frame disposed at the left side of the control layer 1760 is less than a width 1762 of an area of the frame disposed at the right side of the control layer 1760.

Figure 18:
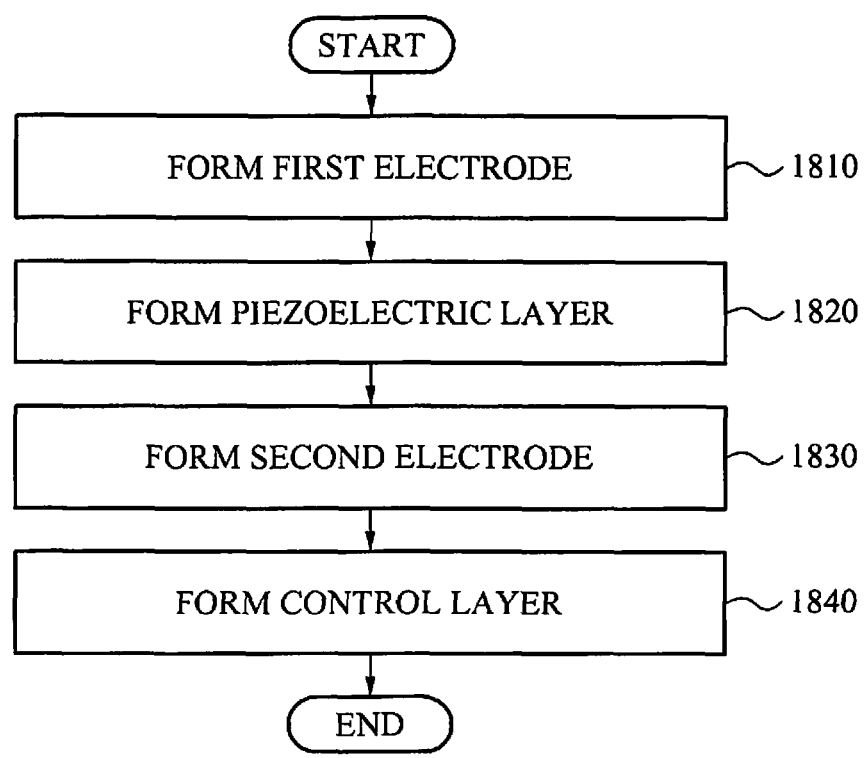
FIG. 18 is a flowchart illustrating an example of a method of fabricating a resonator.

FIG. 18 is a flowchart illustrating an example of a method of fabricating a resonator.

Referring to FIG. 18, in 1810, a method for fabricating a resonator may include forming a first electrode on a substrate. In this example, a resonance region of the first electrode may be disposed at least a predetermined distance away from the substrate that supports the resonator, so as to provide an air-gap cavity between the substrate and the first electrode as shown in FIG. 1. The first electrode may input an electrical energy to a piezoelectric layer to be formed in 1820.

In 1820, the method for fabricating a resonator may include forming a piezoelectric layer on the first electrode formed in 1810. In one example, the piezoelectric layer may be made from a piezoelectric material, and may convert an electrical energy input from the first electrode and the second electrode into an acoustic wave. The acoustic wave being converted by the piezoelectric layer may include a longitudinal acoustic wave and a transverse acoustic wave.

In 1830, the method for fabricating a resonator may include forming a second electrode on the piezoelectric layer formed in 1820. The second electrode may input an electrical energy to the piezoelectric layer formed in 1820.

In 1840, the method for fabricating a resonator may include forming a control layer including an irregular-shaped frame on the second electrode formed in 1830.

In this example, the control layer may reflect the transverse acoustic wave that is not used in generating resonance by using the frame. The frame includes at least one uneven portion on an inner side surface or an outer side surface, in order to trap the transverse acoustic wave inside the resonator. For example, the frame may be formed in a shape of a closed curved surface and may include at least one uneven portion on an inner side surface of the closed curved surface as shown in FIG. 2A or 4. Also, the frame may be formed in a shape of a circle or a polygon and may include at least one uneven portion on an outer side surface as shown in FIG. 6 or 7. Also, the frame may be formed in a shape of a closed curved surface and may include at least one uneven portion on an inner side surface and an outer side surface of the closed curved surface as shown in FIG. 8.

Also, the control layer may include a plurality of frames arranged in a horizontal direction as shown in FIG. 11, or may include a plurality of frames arranged in a vertical direction as shown in FIG. 13.

Also, the frame may be formed in a shape of a discontinuous closed curved surface having at least one opening as shown in FIG. 14, and may be formed in a closed curved surface having an area with an uneven portion and the other area without an uneven portion as shown in FIG. 15.

In particular, the method for fabricating a resonator may include forming the control layer by depositing a layer on the second electrode, patterning the layer, and etching the layer into the shape of the frame on the second electrode formed in 1830. For example, the control layer may be formed by patterning at least one material of Mo, Ru, Au, $SiO_2$, and SiN on the second electrode, and then performing an etching process.

Also, in 1840, the method for fabricating a resonator may include forming the control layer including the non-uniform frame below the first electrode formed in 1810 as shown in FIG. 9 or 10. In this example, the control layer may be disposed in the air-gap cavity between the substrate and the first electrode.

Figure 19:
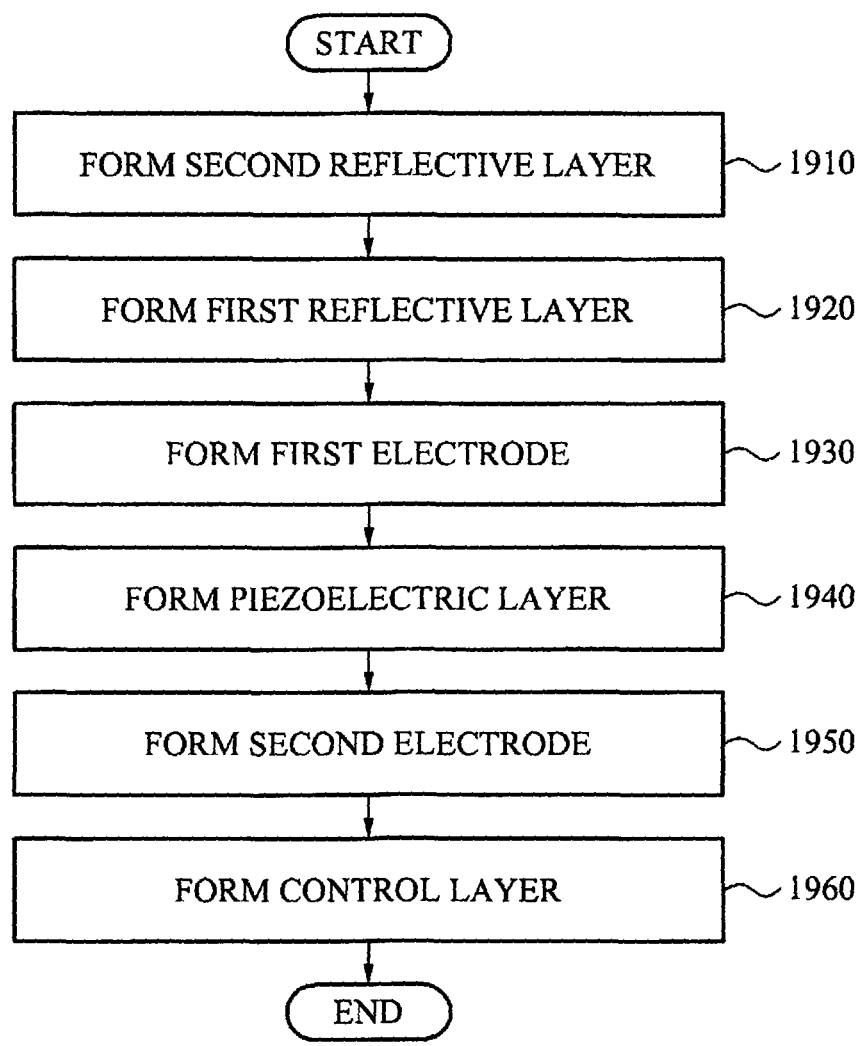
FIG. 19 is a flowchart illustrating another example of a method of fabricating a resonator.

FIG. 19 is a flowchart illustrating another example of a method of fabricating a resonator.

Referring to FIG. 19, the example of the method of fabricating a resonator may result in the fabrication of a Bragg reflector-type BAW resonator.

In 1910, the method for fabricating a resonator may include forming a second reflective layer on a substrate. In this example, the method for fabricating a resonator may involve forming the second reflective layer directly on the substrate as shown in FIG. 16, and may involve forming the second reflective layer with an air-gap cavity interposed between the substrate and the second reflective layer such that the second reflective layer may have a portion spaced at least a predetermined distance away from the substrate as shown in FIG. 17.

In 1920, the method for fabricating a resonator may involve forming a first reflective layer on the second reflective layer formed in 1910. In this example, the first reflective layer may have a relatively lower acoustic impedance than that of the second reflective layer.

In 1930, the method for fabricating a resonator may involve forming a first electrode on the first reflective layer formed in 1920. In this example, the first electrode may input an electrical energy to a piezoelectric layer to be formed in 1940.

In 1940, the method for fabricating a resonator may involve forming a piezoelectric layer on the first electrode formed in 1930. In this example, the piezoelectric layer may be made from a piezoelectric material, and may convert an electrical energy input from the first electrode and the second electrode into an acoustic wave. The acoustic wave being converted by the piezoelectric layer may include a longitudinal acoustic wave and a transverse acoustic wave.

In 1950, the method for fabricating a resonator may involve forming a second electrode on the piezoelectric layer formed in 1940. In this example, the second electrode may input an electrical energy to the piezoelectric layer formed in 1940.

In 1960, the method for fabricating a resonator may form a control layer including a non-uniform frame on the second electrode formed in 1950.

In this example, the control layer may reflect the transverse acoustic wave that is not used in generating resonance by using the frame including at least one uneven portion on an inner side surface or an outer side surface, in order to trap the transverse acoustic wave inside the resonator. For example, the frame may have a shape of a closed curved surface and may include at least one uneven portion on an inner side surface of the closed curved surface as shown in FIG. 2A or 4. Also, the frame may be provided in a form of a circle or a polygon and may include at least one uneven portion on an outer side surface as shown in FIG. 6 or 7. Also, the frame may be provided in a form of a closed curved surface and may include at least one uneven portion on an inner side surface and an outer side surface of the closed curved surface as shown in FIG. 8.

Also, the control layer may include a plurality of frames arranged in a horizontal direction as shown in FIG. 11, or may include a plurality of frames arranged in a vertical direction as shown in FIG. 13.

Also, the frame may be formed substantially in a shape of a closed curved surface, except that there is a discontinuation in the frame with at least one opening, as shown in FIG. 14. Further, in another example, the frame may be formed in a shape of a closed curved surface having an area with an uneven portion and the other area without an uneven portion on the inner side surface thereof, as shown in FIG. 15.

In particular, the apparatus for fabricating a resonator may be fabricated by forming the control layer by depositing a layer on the second electrode, patterning the layer, and etching the layer to a desired shape of the frame on the second electrode formed in 1950. For example, the control layer may be formed by patterning at least one material of Mo, Ru, Au, $SiO_2$, and SiN on the second electrode, and then performing an etching process.

Also, when an air-gap cavity is formed between the substrate and the second reflective layer in 1910, the method for fabricating a resonator may, in 1960, involve forming the control layer including the non-uniform frame below the first electrode formed in 1930 as shown in FIG. 9 or 10. In this example, the control layer may be disposed in the air-gap cavity between the substrate and the first electrode.

The methods according to the above-described examples may be recorded in non-transitory computer-readable media including program instructions to implement various operations embodied by a computer. The media may also include, alone or in combination with the program instructions, data files, data structures, and the like. Examples of non-transitory computer-readable media include magnetic media such as hard discs, floppy discs, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments, or vice versa.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A resonator comprising:
   a first electrode disposed on a substrate;
   a piezoelectric layer disposed on the first electrode;
   a second electrode disposed on the piezoelectric layer; and
   a control layer disposed on the second electrode and comprising a frame with an uneven surface.

2. The resonator of claim 1, wherein the piezoelectric layer is configured to convert an electrical energy input from the first electrode into an acoustic wave; and
   the frame with the uneven surface is configured to control the acoustic wave.

3. The resonator of claim 1, wherein the frame has a shape of a closed curved surface in a plan view, and the uneven surface is disposed on an inner side surface of the frame.

4. The resonator of claim 1, wherein the uneven surface of the frame comprises a circular concave portion or a polygonal concave portion.

5. The resonator of claim 1, wherein the control layer is disposed on the second electrode with a shape of a closed curved surface in a plan view, and the control layer comprises the uneven surface on an inner side surface and another uneven surface on an outer side surface of the frame.

6. The resonator of claim 1, wherein the uneven surface of the frame comprises at least one circular concave portion and at least one polygonal concave portion.

7. The resonator of claim 1, wherein the control layer further comprises a second frame arranged horizontally from the frame.

8. The resonator of claim 1, wherein the control layer further comprises a second frame arranged vertically from the frame.

9. The resonator of claim 1, wherein the control layer has a shape of a discontinuous curved surface having at least one opening, and the uneven surface is disposed on an inner side surface of the frame.

10. The resonator of claim 1, wherein the control layer is disposed on the second electrode with an edge of the closed curved surface disposed along a periphery of the second electrode in a plan view, and a thickness, a height, or a width of a first area of the frame differs from a thickness, a height, or a width of a second area of the frame disposed opposite to the first area.

11. The resonator of claim 1, further comprising:
    a reflective layer configured to reflect an acoustic wave based on a signal applied to the first electrode and the second electrode.

12. The resonator of claim 11, wherein the reflective layer comprises:
    a first reflective layer disposed below the first electrode; and
    a second reflective layer disposed below the first reflective layer, the second reflective layer having a higher acoustic impedance than the first reflective layer.

13. A resonator comprising:
    a first electrode disposed on a substrate, a portion of the first electrode spaced apart from the substrate;
    a piezoelectric layer disposed on the first electrode;
    a second electrode disposed on the piezoelectric layer; and
    a control layer disposed between the first electrode and the substrate and comprising an uneven surface.

14. The resonator of claim 13, wherein the piezoelectric layer is configured to convert energy input from the first electrode into an acoustic wave; and
    the control layer is configured to control the acoustic wave.

15. The resonator of claim 13, wherein the control layer has a shape of a closed curved surface in a plan view, and the uneven surface is disposed on an inner side surface of the control layer.

16. The resonator of claim 13, wherein the uneven surface of the control layer comprises a circular concave portion or a polygonal concave portion, and the uneven surface is disposed on an outer side surface of the control layer.

17. The resonator of claim 13, wherein the control layer has a shape of a closed curved surface in a plan view; the uneven surface is disposed on an inner side surface; and a second uneven surface is disposed on an outer side surface of the control layer.

18. A resonator comprising:
    a reflective layer disposed on a substrate;
    a first electrode disposed on the reflective layer;
    a piezoelectric layer disposed on the first electrode;
    a second electrode disposed on the piezoelectric layer; and
    a control layer disposed on the second electrode and comprising an uneven surface,
    wherein the piezoelectric first electrode is configured to convert energy input from the first electrode into an acoustic wave, and the control layer is configured to control the acoustic wave.

19. The resonator of claim 18, wherein the reflective layer is configured to reflect the acoustic wave converted by the piezoelectric layer based on a signal applied to the first electrode and the second electrode; and
    the first electrode is configured to input the energy to the piezoelectric layer based on the signal applied to the first electrode and the second electrode.

20. The resonator of claim 18, wherein the control layer has a shape of a closed curved surface in a plan view, and comprises the uneven surface on an inner side surface.

21. The resonator of claim 18, wherein the uneven surface of the control layer comprises a circular concave portion or a polygonal concave portion, and the control layer comprises another uneven surface on an outer side surface.

22. The resonator of claim 18, wherein the control layer has a shape of a closed curved surface in a plan view; and the uneven surface is disposed an inner side surface; and another uneven surface is disposed on an outer side surface of the control layer.

23. A method of fabricating a resonator, the method comprising:
   forming a piezoelectric layer on a first electrode;
   forming a second electrode on the piezoelectric layer; and
   forming a control layer on the second electrode,
   wherein the control layer comprises a frame with an uneven surface.

24. The method of claim 23, further comprising:
   forming the first electrode on a substrate before the forming of the piezoelectric layer on the first electrode.

25. The method of claim 24, further comprising:
   forming a reflective layer on a substrate and forming the first electrode on the reflective layer before the forming of the piezoelectric layer on the first electrode,
   wherein the piezoelectric layer is configured to convert an electrical energy input from the first electrode into an acoustic wave, and the control layer is configured to control the acoustic wave.

* * * * *